(12) United States Patent
Laamanen

(10) Patent No.: US 6,940,435 B2
(45) Date of Patent: Sep. 6, 2005

(54) METHOD AND SYSTEM FOR ADJUSTING THE STEP CLOCK OF A DELTA-SIGMA TRANSFORMER AND/OR SWITCHED CAPACITOR FILTER

(75) Inventor: Heikki Laamanen, Espoo (FI)

(73) Assignee: Tellabs Oy, Espoo (FI)

( * ) Notice: Subject to any disclaimer, the term of this patent is extended or adjusted under 35 U.S.C. 154(b) by 203 days.

(21) Appl. No.: 10/399,790

(22) PCT Filed: Nov. 22, 2001

(86) PCT No.: PCT/FI01/01018

§ 371 (c)(1), (2), (4) Date: Apr. 22, 2003

(87) PCT Pub. No.: WO02/43247

PCT Pub. Date: May 30, 2002

(65) Prior Publication Data

US 2004/0037386 A1 Feb. 26, 2004

(51) Int. Cl.[7] .............................................. H03M 1/66
(52) U.S. Cl. ...................................................... 341/143
(58) Field of Search ................................ 341/143, 144, 341/155; 327/105–107, 115, 117, 156–159; 323/127, 128; 331/14, 16, 17, 23; 455/260

(56) References Cited

U.S. PATENT DOCUMENTS

| 4,965,531 | A | | 10/1990 | Riley |
| 5,834,987 | A | * | 11/1998 | Dent .......................... 332/127 |
| 6,169,506 | B1 | | 1/2001 | Oprescu et al. |
| 6,456,164 | B1 | * | 9/2002 | Fan .............................. 331/16 |
| 6,825,784 | B1 | * | 11/2004 | Zhang ......................... 341/131 |
| 6,839,010 | B1 | * | 1/2005 | Tsyrganovich .............. 341/143 |
| 6,842,129 | B1 | * | 1/2005 | Robinson .................... 341/143 |
| 6,873,281 | B1 | * | 3/2005 | Esterberg et al. ........... 341/163 |

FOREIGN PATENT DOCUMENTS

| WO | WO 94/15404 A1 | 7/1994 |
| WO | WO 00/28666 A1 | 5/2000 |
| WO | WO 00/51240 A1 | 8/2000 |

\* cited by examiner

*Primary Examiner*—Brian Young
(74) *Attorney, Agent, or Firm*—Birch, Stewart, Kolasch & Birch, LLP

(57) ABSTRACT

The invention relates to a method and system for implementing a digitally controlled sample and timing clock in a system performing analog and digital signal processing. According to the method, as the timing clock of the digital signal processing is used a clock with a controllable frequency such that said digital signal processing can have a function suited for controlling the frequency of said timing clock, and the conversion of the signal is performed in synchronism with the timing clock of the digital signal processing operation when a delta-sigma converter or a switched-capacitor filter device is employed. According to the invention, the timing and sample clocks are generated by dividing a fixed-frequency clock operating at a frequency substantially higher than that of said timing/sample clock by a digital divider of an integer division factor whose division factor is controlled by means of an at least second-order delta-sigma modulator capable of delivering an output signal of two values so that one of the modulator output signal values selects the division factor to be N while the other value selects the division factor to be N+1, and, further, the delta-sigma modulator controlling the integer-factor divider is adapted to be clocked by the timing signal generated by said integer-factor divider.

8 Claims, 6 Drawing Sheets

Ideal +1 pulse
Fig. 4a
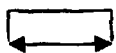
τ
Actual +1 pulse
Fig 4b
Error signal
Fig 4c
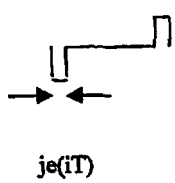
je(iT)
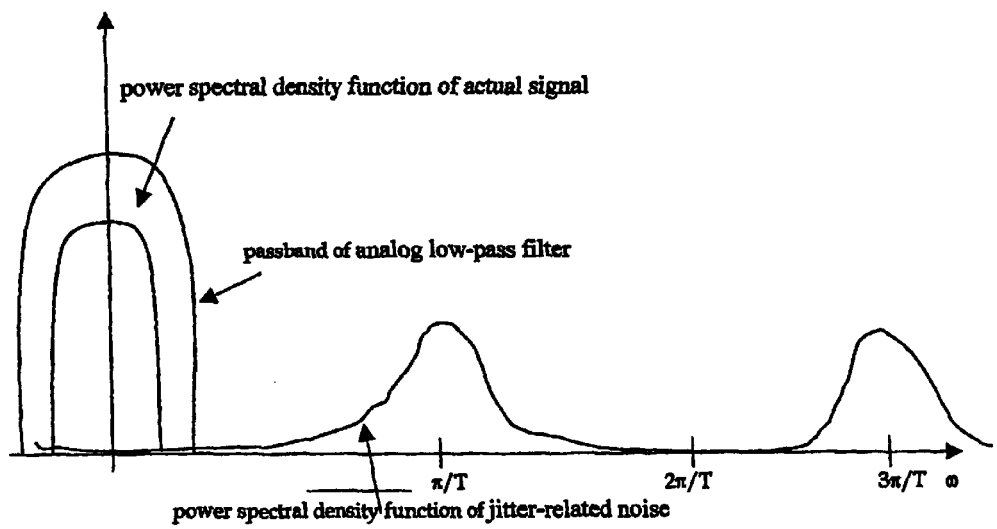
Fig. 5

METHOD AND SYSTEM FOR ADJUSTING THE STEP CLOCK OF A DELTA-SIGMA TRANSFORMER AND/OR SWITCHED CAPACITOR FILTER

This application is the national phase under 35 U.S.C. §371 of PCT International Application No. PCT/FI01/01018 which has an International filing date of Nov. 22, 2001, which designated the United States of America.

BACKGROUND OF THE INVENTION

The invention relates to a method according to the preamble of claim 1 for digital control of a sample clock and a system according to claim 5.

In a device performing digital signal processing, there frequently arises a need for synchronizing the computation rate with the reference clock of an external source. A good example of such a case is a data modem whose receiver is synchronized with the symbol rate of a (PAM and QAM) modulated data signal received over a transmission path. To this end, it is necessary to generate an internal clock with a controllable rate for synchronized computation. Inasmuch also the AD and DA (analog-to-digital and digital-to-analog) converters required at the respective interfaces between the analog and digital worlds are also synchronized to the same clock, the sample clocks of the converters must be designed controllable, too. In practice, sample clocks of such converters are designed to operate at a multiple of the transmission channel symbol clock rate.

A frequently used method for implementing a controllable-rate clock is to use a quartz crystal oscillator whose basic frequency can be tuned with the help of a capacitance diode incorporated in the resonant circuit of the crystal. Typically, the tuning range is in the order of a few hundred ppm (parts per million). However, a crystal oscillator has certain shortcomings. The oscillator contains a great number of components which are awkward to handle in automated production, the device occupies a large footprint on the circuit board, and it is often necessary to use several oscillators to cover desired frequencies. Furthermore, the operating frequency of crystal oscillators featuring a wide tuning range (up to a few hundred ppm) is quite limited reaching maximally to about 30 MHz.

Another generally used technique is based on the use of a digital divider of the clock frequency. Herein, a source clock operating at a high frequency is divided with the help of controllable-ratio digital divider down to the desired sample clock frequency. By adjusting the division ratio, it is possible to control the frequency and phase of the sample clock obtained by division. Such a digital division technique invariably generates jitter on the divided sample clock. Jitter impairs the accuracy of AD and DA conversions inasmuch it causes deviations in the optimal sampling timing. Frequently, the only solution to this problem is to use so high a source clock frequency that allows jitter to be reduced to an acceptable value. Nevertheless, an impossible situation arises if the maximum allowable jitter is, e.g., ±500 ps, whereby the source clock should run at about 2 GHz. Unfortunately, current ASIC technologies facilitate clocks running at 300 to 500 MHz if the ASIC itself is used for clock implementation.

In AD and DA converters based on delta-sigma modulation and switched-capacitor filters, the circuitry of the converter or filter performs sampling at a clock rate much higher than the maximum frequency of signal to be processed.

BRIEF SUMMARY OF THE INVENTION

It is an object of the present invention to overcome the problems of prior-art techniques and to provide an entirely novel type of method for digitally controlling a sample clock.

The goal of the invention is achieved by way of the following concept.

A variable-frequency sample clock for a delta-sigma modulated converter or switched-capacitor filter is obtained using a controllable-ratio digital divider for dividing a source clock operating at a high, fixed frequency. The basic concept is to control the division ratio so that, in the frequency spectrum of the jitter in the divided clock signal, the spurious frequency components of the clock jitter fall on such frequency bands that are filtered away in filters inherently included in the converter or, respectively, in the switched-capacitor filter. In an AD converter, this kind of filter is a digital decimation filter that filters away the quantization noise generated by a delta-sigma modulator at higher frequencies while simultaneously also performing as a decimation filter. In a DA converter, such a filter is the analog output filter that also filters away quantization noise falling on higher frequencies. In a switched-capacitor filter, the filter device contains such a filter as an integral analog filter that serves to smooth the stepped output signal of the switched filter device.

More specifically, the method according to the invention is characterized by what is stated in the characterizing part of claim 1.

Furthermore, the system according to the invention is characterized by what is stated in the characterizing part of claim 5.

The invention offers significant benefits.

The invention makes it possible to substantially reduce the detrimental effect of jitter on analog-to-digital and digital-to-analog conversions, as well as in switched-capacitor filtering, thus offering a wide-range control of the sample clock frequency.

BRIEF DESCRIPTION OF THE DRAWINGS

In the following, the invention will be examined in greater detail with the help of exemplifying embodiments illustrated in the appended drawings in which

FIG. 4a is the waveform of an ideal +1 pulse;

FIG. 4b is the waveform of an actual +1 pulse;

FIG. 4c is the waveform of the error component formed by the difference between the waveforms of FIGS. 4a and 4b;

FIG. 5 is a graph showing the power spectra of the actual signal and the jitter component in the frequency domain as they occur in conjunction with a DA conversion.

DETAILED DESCRIPTION OF THE INVENTION

Obviously, there is needed a mechanism that controls the digital divider (in practical terms: a divider with an integer division factor of N or N+1, as defined by a control signal) so that desired properties of the jitter power spectrum are obtained. It will be proved hereinafter that jitter power spectrum should fall as much as possible at high frequencies. This condition will be fulfilled by means of controlling the N/N+1 divider by a 1-bit signal produced by a delta-sigma modulator of a sufficiently high order. Resultingly, this kind of modulator converts a digital signal of a high bit resolution into a 1-bit control signal that determines whether the divider performs the next division using the integer factor N or N+1. The 1-bit output signal of the modulator has an average value that is very close to the modulator input signal but also contains a large quantization noise component. The power spectrum of quantization noise falls for its major part on higher frequencies which is a characteristic property of a delta-sigma modulator. The use of a delta-sigma modulator in the control of an N/N+1 divider is technique well known in the art. E.g., U.S. Pat. No. 4,965,531 teaches that a desired shaping of the jitter power spectral density function needs a modulator of at least second order. If the order of the modulator is K, the jitter power spectrum of the clock generated by a N/N+1 divider has a (K−1)-tuple zero at zero frequency. Accordingly, the jitter power spectrum is accentuated on high frequencies the more the higher the order of the modulator.

Hereinafter is examined the effect of the jitter of the sample clock of an AD/DA converter and a switched-capacitor filter on the sampled output signal.

The theoretical treatise draws upon mathematical tools conventionally used in analysis of discrete-time sample train signals, such as the Fourier transform, power spectral density and autocorrelation functions and the mathematical relationships therebetween.

Delta-sigma AD Conversion

Let s(t) be a stochastically varying time-function representing a signal. Respectively, let the time continuous signal s(t) be converted into a sample sequence s(iT) having a power spectral density function $S_s(\theta)$ (argument $-\pi < \theta \leq \pi$). Let the average time interval of the converter sample clock be T. Then, the clock would tick at time instants t=iT with the provision that the clock is ideal. The jitter-related error arises already at the converter input, where the value of the analog signal is stored by (analog) sample-and-hold circuitry at the instant of sampling.

Assuming that the clock of the sample-and-hold circuit (in practice, a switched-capacitor circuit) operating at the input of the AD converter has jitter, the instantaneous value of jitter at the sampling instant t=iT can be denoted by symbol je(iT).

The jitter signal power spectral density function is denoted by Sje(θ).

Figure 1:
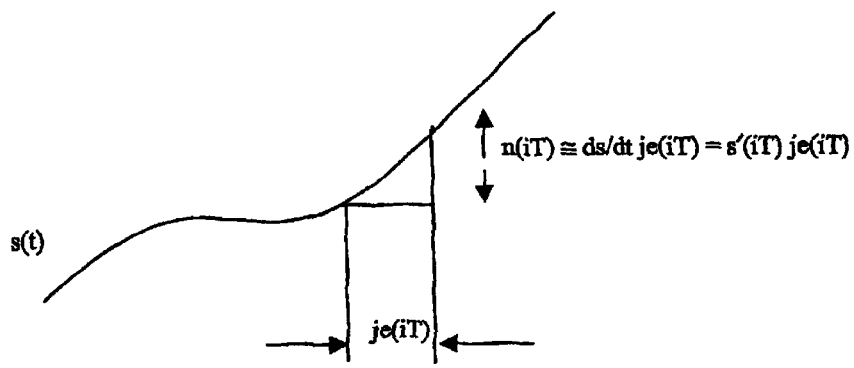
FIG. 1 is a graph illustrating the error caused by the jitter on the sample value of a time-varying signal s(t)

Now referring to FIG. 1, the error caused by jitter is examined at time instant iT:

The power of the instantaneous signal error n(iT) due to the jitter shift (denoted by je(iT)) of the sampling instant can be written as a mean value of the squared error:

$$P_n = <n^2(iT)> = <s'^2(iT)je^2(iT)> = <s'^2(iT)><je^2(iT)>$$

The last format of the equation results therefrom that the signal and the jitter do not correlate with each other.

The decimation filter of the converter filters away a major portion of the noise power. Hence, it is hereinafter appropriate to derive the frequency-domain characteristics of the sampling error related to jitter.

Power Spectral Density Function of Noise Generated by Error in Sampling Instant

The power spectral density function of a stochastic signal formed by a sequence of samples is obtained as the Fourier transform of the discrete-time autocorrelation function of the signal.

First, the autocorrelation function $R_n(k)$ of the signal error component n(iT) is computed:

$$R_n(k) = <n(iT)n((i+k)T)> = <s'(iT)je(iT)s'((i+k)T)je((i+k)T)> = <s'(iT)s'((i+k)T)><je(iT)je((i+k)T)> = R_{s'}(k)R_{je}(k)$$

In the grouping and manipulation of the expected value operators < >, advantage is taken from the complete independence between the signal value and the effect of the jitter.

Accordingly, the autocorrelation function is formed by the product of the time-domain functions of two sample sequences. Consequently, the Fourier transform thereof can be expressed as a convolution of these functions in the frequency domain:

$$S_n(\theta) = S_{s'}(\theta) * S_{je}(\theta) = 1/(2\pi) \int_{-\pi}^{+\pi} S_{s'}(\lambda) S_{je}(\lambda - \theta) d\lambda$$

The equation contains the power spectral density function of the sample sequence s'(iT) of the derivative s'(t) of the initially time-continuous signal s(t). As known, the power spectral density of the derivative of a time-continuous signal can be written as (denoting angular frequency with symbol ω):

$$\omega^2 S_s(\omega) = \text{power spectral density of } s'(t)$$

where $S_s(\omega)$ is the power spectral density function of a time-continuous signal s(t). As a consequence, the power spectral density of the sample sequence s'(iT) can be written with a sufficiently good accuracy as follows (inasmuch the angular variable of the Fourier transform of a discrete-time signal is θ=ωT and since $S_s(\omega)$ is band-limited):

$$S_{s'}(\theta) = (\theta/T)^2 S_s(\theta/T)$$

giving $$S_n(\theta) = 1/T^2 (\theta^2 S_s(\theta/T)) * S_{je}(\theta) = 1/(2\pi T^2) \int_{-\pi}^{+\pi} \lambda^2 S_s(\lambda/T) S_{je}(\lambda - \theta) d\lambda$$

This is an important result. It must be appreciated that asterisk (*) in the above equation denotes a convolution operation carried out in the frequency domain.

Figure 2:
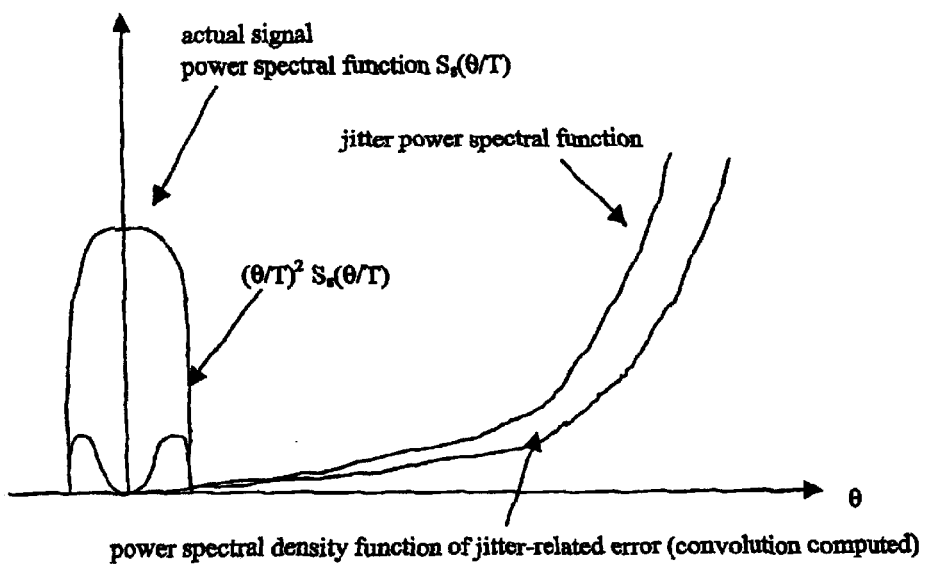
FIG. 2 is a graph illustrating the power spectra of the actual signal and the jitter thereof in the frequency domain.

The result of manipulation confirms that the power spectral density function of the error component due to jitter of the sampling instant is concentrated on the higher frequencies as shown in FIG. 2. Hence, the decimation filter which is an integral part of a delta-sigma AD converter can filter away a major portion of the power spectral density of the error component thus preventing jitter from causing an essential deterioration of the accuracy of the AD conversion.

Delta-sigma DA Conversion

A delta-sigma DA conversion (performed using a digital-to-analog converter) converts a discrete-time signal of samples taken at a high bit resolution and at a given sampling rate into another sample sequence which has a much higher sample rate but contains samples of a resolution of only a single bit or a few bits maximum.

Resultingly, the latter sampled signal involves a quantization noise of a high power, however, so that the power spectral density of the noise component concentrates on high frequencies. Resultingly, the quantization noise can be substantially filtered away by means of an analog low-pass filter with the provision that the signal is first converted into analog format with the help of a simple 1-bit DA converter (or maximally of a few-bit resolution).

Figure 3:
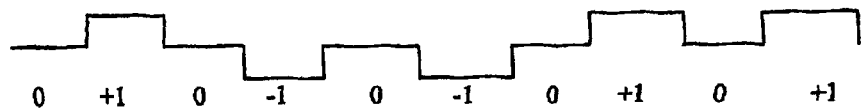
FIG. 3 is a graph showing the output signal of a delta-sigma DA converter with the jitter imposing an error thereon.

If the clock of the delta-sigma DA converter contains jitter, the converter output signal interfacing the analog environment will have an error component caused by the jitter. The following discussion is valid for a DA converter whose output signal generally has 1-bit resolution of the RZ (return-to-zero) type, whereby the output signal between the bits is taken to zero as shown in FIG. 3.

An additional assumption is that the clock is adjusted so as to cause jitter only on the zero-state period and that both the +1 level and the −1 level have a constant duration (τ). Then, the error signal at a given time instant iT can be obtained by comparing the ideal +1 or −1 level pulse with the actual pulse as shown in FIGS. 4a–4c.

The value of the error signal pulse in the vicinity of the time instant iT can be approximately written as $$\text{sign}(iT)je(iT)[\delta(t-iT)-\delta(t-(iT+\tau))]$$

where sign(iT) is the sign of the +1 or −1 level pulse at time instant iT and δ(t−t0) is the impulse function at time instant t0.

The overall error signal in a time-continuous time domain is the sequence of these individual error pulses:

$$\varepsilon(t) = \sum_i \text{sign}(iT)je(iT)[\delta(t-iT) - \delta(t-(iT+\tau))]$$

The power spectral density function of this signal is:

$$S_\varepsilon(\omega) = \sum_k [S_{sign}(\omega - 2\pi k/T) * S_{je}(\omega - 2\pi k/T)]\sin^2((\omega - 2\pi k/T)\tau/2)$$

where symbol * means convolution in the frequency domain. This function is shown graphically in FIG. 5.

The sine function in the equation of the power spectral density function causes a zero in the power spectrum at angular frequencies ω=k2π/T. Resultingly, a minimal amount of noise energy falls on frequencies related to the actual signal. The analog low-pass filter that is an integral part of a DA converter filters away the noise signal components that are located above the frequency spectrum of the actual signal. Thus the clock jitter is prevented from causing an essential deterioration of the accuracy of the DA conversion.

It must be noted that the locations at which the zeroes occur in the power spectral density function of the noise signal are independent from the shape of the power spectral density function of the jitter.

Switched-capacitor Filter

The output of a switched-capacitor filter is provided with a hold circuit that keeps the output signal at a constant level over the duration of filter's system clock cycle. Hence, the filter output signal resembles a stepped waveform. An integral part of the filter is an analog filter for output signal filtering so that the stepped waveform is smoothed and thus the harmonic components of the signal spectrum are removed.

Figure 6A:
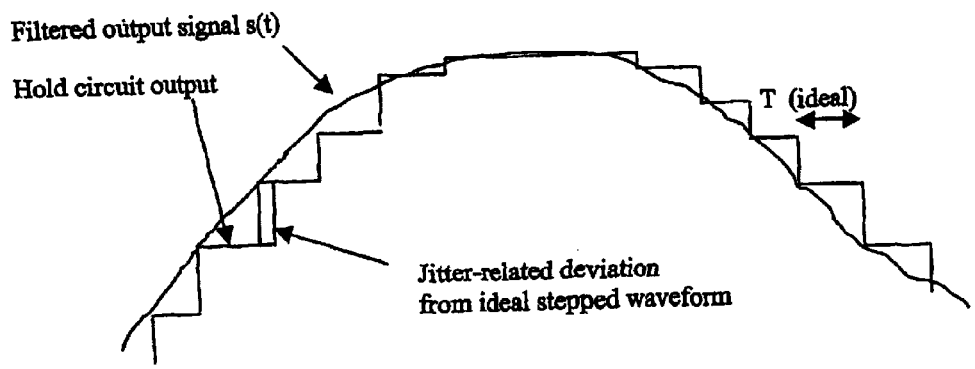
FIGS. 6a and 6b are graphs showing the output signal error or a switched-capacitor fitter due to jitter.
Figure 6B:
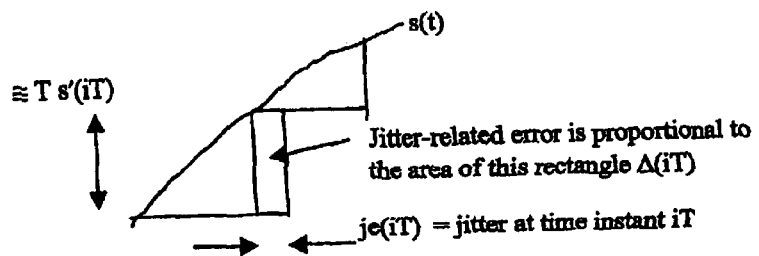
Figure 7:
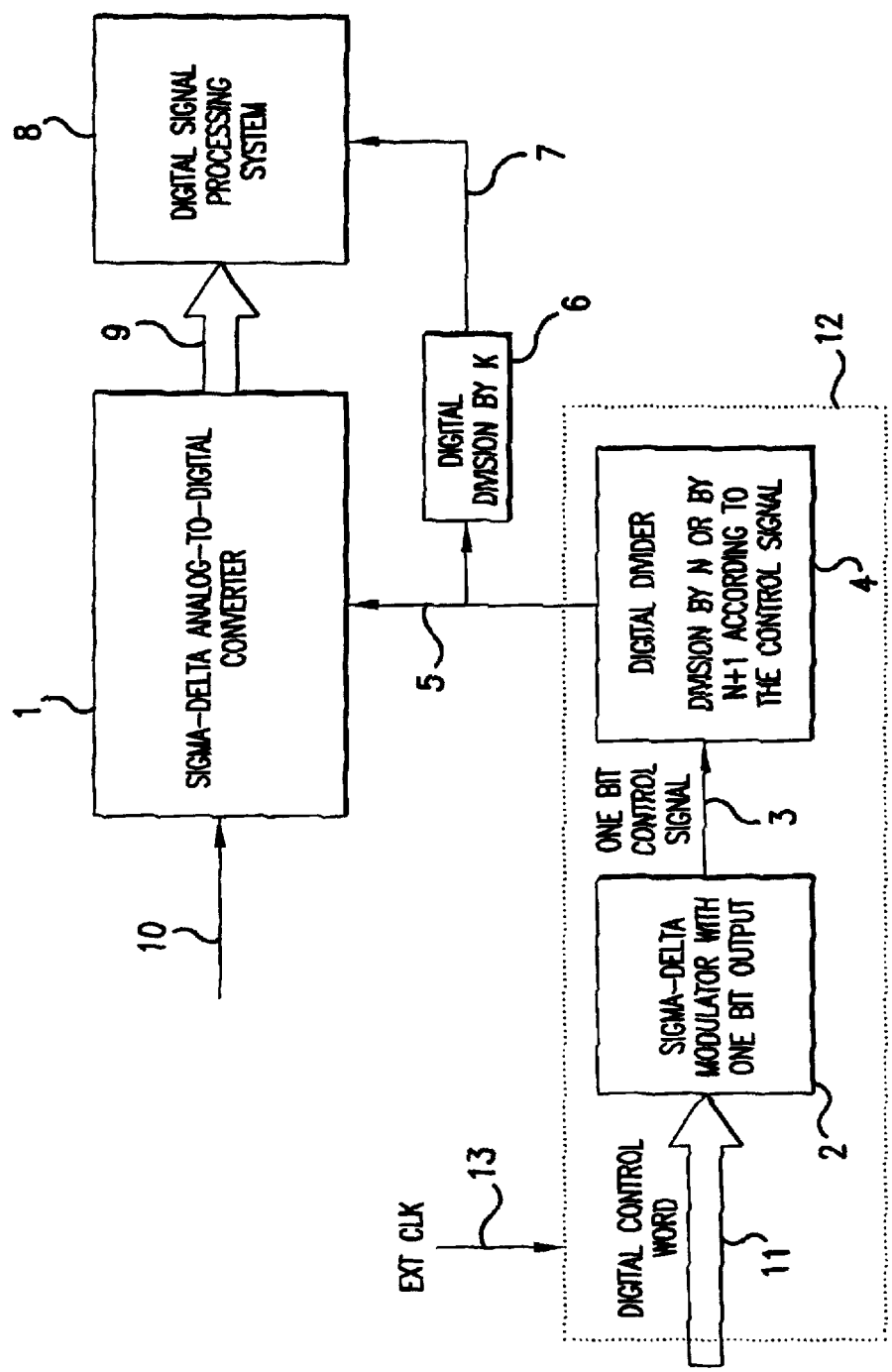
FIG. 7 is a block diagram of a sampling clock for a sigma-delta analog-to-digital converter.
Figure 8:
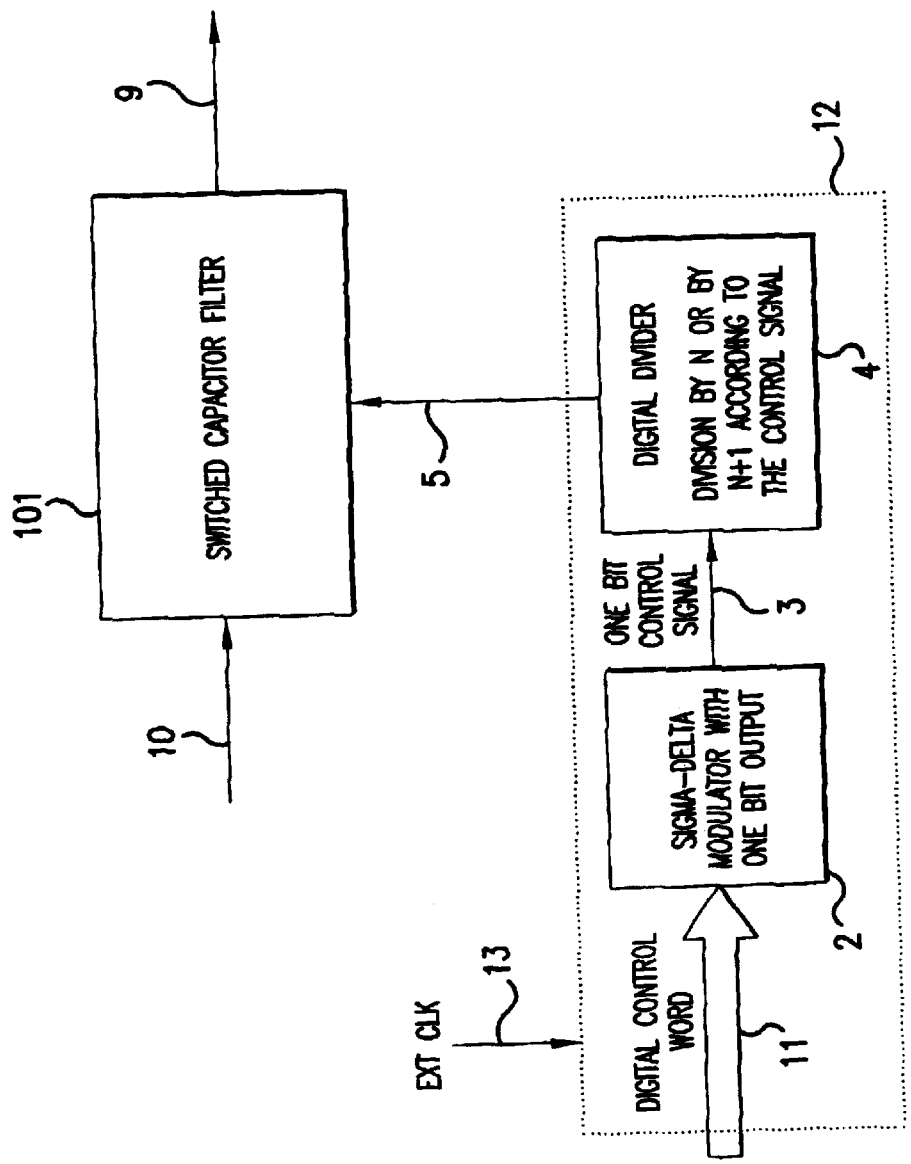
FIG. 8 is a block diagram of a sampling clock for a switched capacitor filter.
Figure 9:
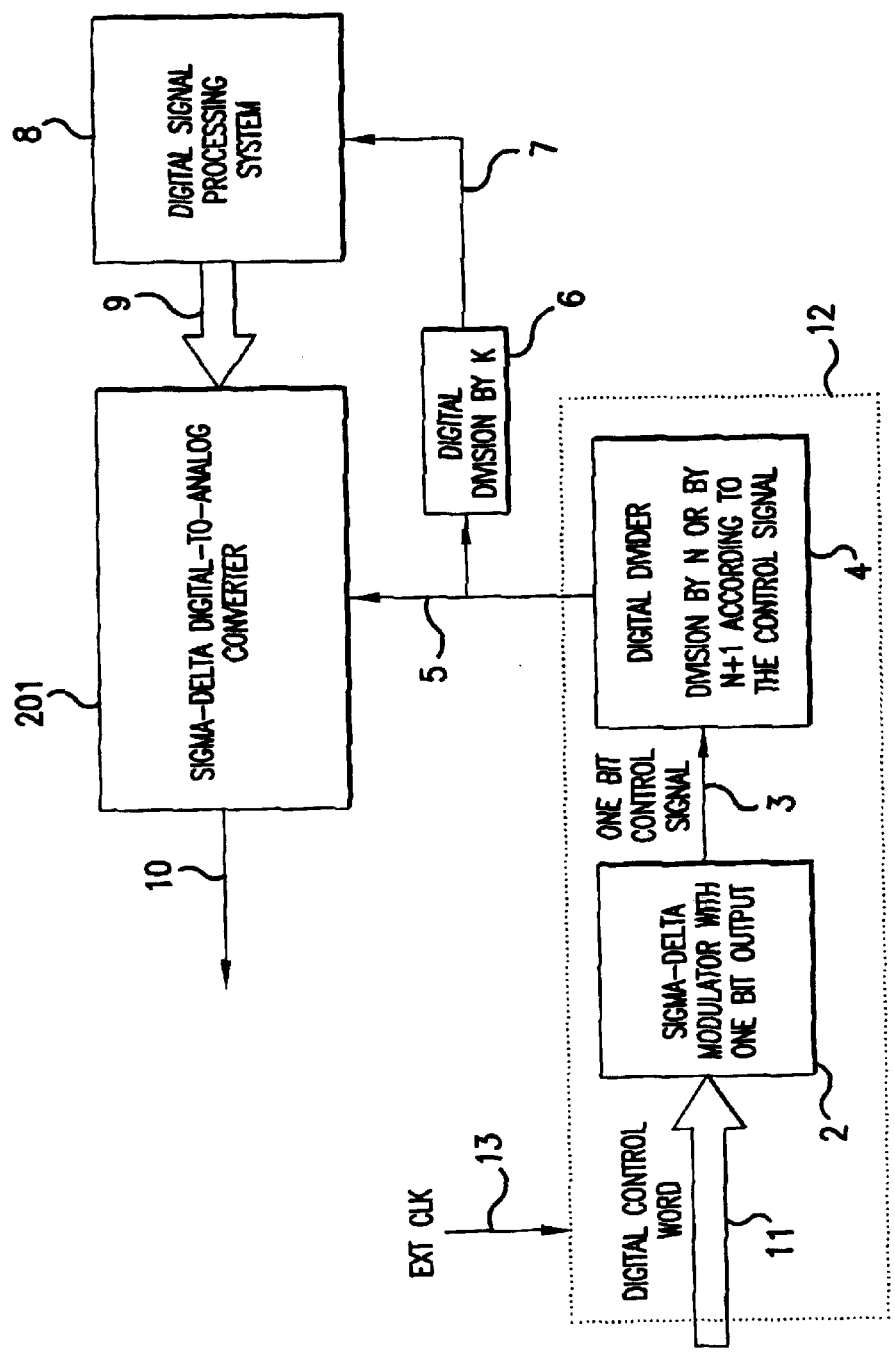
FIG. 9 is a block diagram of a sampling clock for a sigma-delta digital-to-analog converter.

If the clock signal of a switched-capacitor filter has jitter, the stepped-waveform output signal delivered by the hold circuit contains a jitter-related error component as illustrated in FIGS. 6a and 6b.

The area of the rectangle representing the instantaneous value of the jitter-related error is:

$$\Delta(iT) \cong Ts'(iT)je(iT)$$

The areas of these rectangles form a sample sequence having a character identical that discussed earlier in conjunction with AD conversion. Hence, the results of the earlier analysis can be applied hereto in a straightforward manner allowing the following conclusions to be drawn:

If a switched-capacitor filter is clocked with a jitter-containing clock signal whose phase jitter signal has in its power spectral density function one or more zeroes at zero frequency, the power spectral density function of the jitter-related signal error concentrates at higher frequencies. Then, the analog low-pass filter which is an integral part of a switched-capacitor filter can filter away a major portion of the power spectral density of the error component thus preventing jitter from causing an essential deterioration of the filter characteristics by clock jitter.

What is claimed is:

1. A method for implementing a digitally controlled sample and timing clock in a system performing analog and digital signal processing, the method comprising the steps of:

using for the timing clock of said digital signal processing a clock with a controllable frequency such that said digital signal processing can have a function suited for controlling the frequency of said timing clock, and converting the signal in synchronism with the timing clock of said digital signal processing when a delta-sigma converter or a switched-capacitor filter device is employed, wherein said timing and sample clocks are generated by dividing a fixed-frequency clock operating at a frequency substantially higher than that of said timing/sample clock by a digital divider of an integer division factor whose division factor is controlled by means of an at least second-degree delta-sigma modulator capable of delivering an output signal of two values so that one of the modulator output signal values selects the division factor to be N while the other value selects the division factor to be N+1, and the delta-sigma modulator controlling said integer-factor divider is adapted to be clocked by the timing signal generated by said integer-factor divider.

2. The method of claim 1, the method comprising the step of performing signal conversion at the analog-to-digital signal processing interface by means of an analog-to-digital converter based on a delta-sigma modulator so that the timing clock of the converter is synchronized with the timing clock of the digital signal processing system, characterized in that said timing and sample clocks are generated by dividing a fixed-frequency clock operating at a frequency substantially higher than that of said timing/sample clock by a divider of an integer division factor whose division factor is controlled by means of an at least second-order delta-sigma modulator capable of delivering an output signal of two values so that one of the modulator output signal values selects the division factor to be N while the other value selects the division factor to be N+1, and the delta-sigma modulator controlling said integer-factor divider is adapted to be clocked by the timing signal generated by said integer-factor divider.

3. The method of claim 1, the method comprising the step of performing signal conversion at the digital-to-analog signal processing interface by means of a digital-to-analog converter based on a delta-sigma modulator so that the timing clock of the converter is synchronized with the timing clock of the digital signal processing system, characterized in that said timing and sample clocks are generated by dividing a fixed-frequency clock operating at a frequency substantially higher than that of said timing/sample clock by a divider of an integer division factor whose division factor is controlled by means of an at least second-degree delta-sigma modulator capable of delivering an output signal of two values so that one of the modulator output signal values selects the division factor to be N while the other value selects the division factor to be N+1, the delta-sigma modulator controlling said integer-factor divider is adapted to be clocked by the timing signal generated by said integer-factor divider, and the single-bit or multi-bit digital-to-analog conversion stage forming an integral part of the delta-sigma modulator based digital-to-analog converter is adapted to produce an RZ-type pulse train at the converter output so that the converter output signal is forced into a return-to-zero state for a certain period between the actual signal states so that the duration of the actual signal state is kept constant, whereby only the duration of the zero state is allowed to jitter as a consequence of the digital frequency division performed by the N/N+1 divider.

4. The method of claim 1, the method comprising the step of performing the processing of an analog signal by means of a switched-capacitor filter technique wherein the timing clock of the filter mechanism is synchronized with the timing clock of the digital signal processing system, characterized in that said timing and sample clocks are generated by dividing a fixed-frequency clock operating at a frequency substantially higher than that of said timing/sample clock by a divider of an integer division factor whose division factor is controlled by means of an at least second-degree delta-sigma modulator capable of delivering an output signal of two values so that one of the modulator output signal values selects the division factor to be N while the other value selects the division factor to be N+1, and the delta-sigma modulator controlling said integer-factor divider is adapted to be clocked by the timing signal generated by said integer-factor divider.

5. A system for implementing a digitally controlled sample and timing clock in a system performing analog and digital signal processing, the system comprising as the timing clock of said digital signal processing comprising:
   a clock with a controllable frequency, which is the timing clock of said digital signal processing, such that said digital signal processing can have a function suited for controlling the frequency of said timing clock, and
   means for converting the signal in synchronism with the timing clock of said digital signal processing when a delta-sigma converter or a switched-capacitor filter device is employed,
   wherein said timing and sample clocks are generated by dividing a fixed-frequency clock operating at a frequency substantially higher than that of said timing/sample clock by a divider of an integer division factor whose division factor is controlled by means of an at least second-degree delta-sigma modulator capable of delivering an output signal of two values so that one of the modulator output signal values selects the division factor to be N while the other value selects the division factor to be N+1, and the delta-sigma modulator controlling said integer-factor divider is adapted to be clocked by the timing signal generated by said integer-factor divider.

6. The system of claim 5 comprising means for performing signal conversion at the analog-to-digital signal processing interface by means of an analog-to-digital converter based on a delta-sigma modulator so that the timing clock of the converter is synchronized with the timing clock of the digital signal processing system, characterized in that said timing and sample clocks are generated by dividing a fixed-frequency clock operating at a frequency substantially higher than that of said timing/sample clock by a divider of an integer division factor whose division factor is controlled by means of an at least second-degree delta-sigma modulator capable of delivering an output signal of two values so that one of the modulator output signal values selects the division factor to be N while the other value selects the division factor to be N+1, and the delta-sigma modulator controlling said integer-factor divider is adapted to be clocked by the timing signal generated by said integer-factor divider.

7. The system of claim 5 comprising means for performing signal conversion at the digital-to-analog signal processing interface by means of a digital-to analog converter based on a delta-sigma modulator so that the timing clock of the converter is synchronized with the timing clock of the digital signal processing system, characterized in that said timing and sample clocks are generated by dividing a fixed-frequency clock operating at a frequency substantially higher than that of said timing/sample clock by a divider of an integer division factor whose division factor is controlled by means of an at least second-order delta-sigma modulator capable of delivering an output signal of two values so that one of the modulator output signal values selects the division factor to be N while the other value selects the division factor to be N+1, the delta-sigma modulator controlling said integer-factor divider is adapted to be clocked by the timing signal generated by said integer-factor divider, and the single-bit or multi-bit digital-to-analog conversion stage forming an integral part of the delta-sigma modulator based digital-to-analog converter is adapted to produce an RZ-type pulse train at the converter output so that the converter output signal is forced into a return-to-zero state for a certain period between the actual signal states so that the duration of the actual signal state is kept constant, whereby only the duration of the zero state is allowed to jitter as a consequence of the digital frequency division performed by the N/N+1 divider.

8. The system of claim 5 comprising means for performing the processing of an analog signal by means of a switched-capacitor filter technique wherein the timing clock of the filter mechanism is synchronized with the timing clock of the digital signal processing system, characterized in that said timing and sample clocks are generated by dividing a fixed-frequency clock operating at a frequency substantially higher than that of said timing/sample clock by a divider of an integer division factor whose division factor is controlled by means of an at least second-order delta-sigma modulator capable of delivering an output signal of two values so that one of the modulator output signal values selects the division factor to be N while the other value selects the division factor to be N+1, and the delta-sigma modulator controlling said integer-factor divider is adapted to be clocked by the timing signal generated by said integer-factor divider.

* * * * *

UNITED STATES PATENT AND TRADEMARK OFFICE
CERTIFICATE OF CORRECTION

PATENT NO. : 6,940,435 B2
DATED : September 6, 2005
INVENTOR(S) : Heikki Laamanen It is certified that error appears in the above-identified patent and that said Letters Patent is hereby corrected as shown below:

Title page,
Insert Item -- [30] Foreign Application Priority Data
      Nov. 22, 2000  (FI) ............................. 20002564 --.

Signed and Sealed this

Seventeenth Day of January, 2006

JON W. DUDAS
*Director of the United States Patent and Trademark Office*